United States Patent [19]
van Rumpt

[11] Patent Number: 5,594,621
[45] Date of Patent: Jan. 14, 1997

[54] MOTHERBOARD FOR A COMPUTER OF THE AT TYPE, AND A COMPUTER OF THE AT TYPE COMPRISING SUCH MOTHERBOARD.

[75] Inventor: Herman W. van Rumpt, 's-Hertogenbosch, Netherlands

[73] Assignee: Tulip Computers International B.V., Netherlands

[21] Appl. No.: 489,808

[22] Filed: Jun. 13, 1995

[30] Foreign Application Priority Data

Jun. 14, 1994 [NL] Netherlands ............... 9400967

[51] Int. Cl.⁶ ............... H05K 7/04; G06F 13/42
[52] U.S. Cl. ............... 361/686; 361/684; 395/800; 439/61; 439/631
[58] Field of Search ............... 361/685, 686, 361/736, 742, 748, 760, 761, 784, 788, 790, 792, 683, 679, 684; 439/61, 62, 64, 65, 629–632; 395/800

[56] References Cited

U.S. PATENT DOCUMENTS

| | | | |
|---|---|---|---|
| 5,038,308 | 8/1991 | Le et al. | 364/708.1 |
| 5,051,096 | 9/1991 | Cooke et al. | 439/61 |
| 5,121,295 | 6/1992 | Lam | 361/395 |
| 5,162,675 | 11/1992 | Olsen et al. | 307/465 |
| 5,440,755 | 8/1995 | Harwer et al. | 395/800 |

FOREIGN PATENT DOCUMENTS

| | | |
|---|---|---|
| 0488057 | 6/1992 | European Pat. Off. . |
| 0591657 | 4/1994 | European Pat. Off. . |
| 9107717 | 5/1991 | WIPO . |
| 9320517 | 10/1993 | WIPO . |

Primary Examiner—Leo P. Picard
Assistant Examiner—Lynn D. Feild
Attorney, Agent, or Firm—Michaelson & Wallace; Peter L. Michaelson

[57] ABSTRACT

By placing the riser card comprising connectors for both ISA and IPC expansion cards in a connector arranged on the side of the motherboard of a computer of the AT type rather than in a connector arranged centrally of the motherboard, a large number of advantages are obtained: the routing of PCI signals is shortened; the cooling within the computer housing is improved; the components on the PCI expansion cards come to lie at the top of the card; the case for the computer can be simplified and there is no longer any connector arranged centrally of the motherboard which made the through-connection between components on opposite sides thereof rather difficult.

6 Claims, 2 Drawing Sheets

MOTHERBOARD FOR A COMPUTER OF THE AT TYPE, AND A COMPUTER OF THE AT TYPE COMPRISING SUCH MOTHERBOARD.

BACKGROUND OF THE INVENTION

This invention relates to a motherboard for a computer of the AT type, comprising a connector for a fiber card to be arranged vertically on the plane of the motherboard and a riser card arranged in that connector, said riser card having a predetermined number of positions for expansion cards and comprising a number of connectors, substantially arranged in a row parallel above each other, for such expansion cards, while the plane of an expansion card, when it is arranged in a connector of the fiber card, extends substantially parallel to the plane of the motherboard.

A (personal) computer of the AT type or a computer which is compatible therewith always comprises a motherboard on which are provided the processor, memory chips, various integrated circuits, for instance for the BIOS, video functions, etc., and connectors for the linking cables of, for instance, an internal hard disk, an internal floppy disk drive of an internal CD-ROM player, etc. Often it is desirable that such a motherboard can be extended with so-called expansion cards already during manufacture or possibly later by the user. Such cards can for instance be video cards, audio cards, control cards for an external CD-ROM player, telefax cards, modem cards, etc. Existing expansion cards are mostly of the so called ISA type and consist of a printed circuit board with electronic components thereon, a number of contact strips provided on the side of the card, which are intended to be placed in a connector of the ISA type arranged on the riser card, and a plate-shaped mounting bracket mounted at one end of the often elongated card and extending perpendicularly to the plane of the card, by means of which the card can be mechanically connected to the housing of the computer, for instance by means of a screw, and on which any terminals for equipment to be externally connected to the card can be provided.

Initially, motherboards for personal computers of the AT type were designed in accordance with the so-called AT form factor, whereby the motherboard itself was provided with a number of connectors for receiving the contact strips on the side of the expansion card. Then the expansion cards extend perpendicularly to the plane of the motherboard.

A drawback of such motherboards was that due to the height of the expansion cards, the case for the computer had to be rather high, which was often undesirable, and that the cooling of the electronic components on the expansion cards was far from optimal due to the vertical arrangement thereof.

Accordingly, for a few years now, for motherboards, use has been made of the so-called LPX form factor (LPX=Low Profile Extender). The motherboard then comprises a connector for a plug-on or so-called riser card. This is a printed board with printed circuitry on which, in a row parallel above each other, a number of connectors are arranged. On one side the riser card comprises contact strips by which it is placed in a connector arranged centrally on the motherboard, in such a manner that the fiber card sits at right angles to the plane of the motherboard. When an expansion card is arranged in the connectors of the riser card, the expansion card comes to lie parallel to the plane of the motherboard. Advantages of motherboards built up in accordance with the LPX form factor are that expansion cards can be fitted or removed from the side of the case; that the cooling of the components on the expansion cards, which are now directed horizontally, is better; and that three to five expansion cards can be arranged without having to arrange as many connectors on the motherboard, as in the case of the AT form factor motherboards, which enables the use of smaller motherboards.

For some time now, in personal computers of the AT type, in addition to the standardized AT bus signals, use has also been made of so-called PCI (Peripheral Connect Interface) signals, which must also be transmitted to and from expansion cards of the PCI type. Such PCI expansion cards have a different configuration of contact strips on the printed circuit board and consequently fit only in a specific PCI connector, which differs from the connectors for the conventional ISA expansion cards.

To make it possible to arrange both ISA expansion cards and PCI expansion cards on a riser card, it has previously been proposed to provide, at one position of the riser card, a connector intended for an ISA expansion card as well as a connector intended for a PCI expansion card, above each other. The result is a so-called combi-connector, consisting of two connectors, so that at one position, as desired, an ISA expansion card or a PCI expansion card can be arranged. However, the drawback of this solution is that due to the physical design and dimensions of the PCI expansion cards, of the ISA expansion cards and of the Connectors therefor, it is necessary to arrange the PCI expansion cards on the upper part of the riser card, i.e. farthest removed from the motherboard, and the ISA expansion cards on the lower part of the riser card. As a result, the linking tracks to the PCI expansion cards, which process high frequency signals (33 MHz), are longest, which is undesirable. Further, the PCI expansion cards, on which the components, with respect to an ISA expansion card, are arranged on the other side of the card, come to lie in the connector on the riser card in such a manner that the components are directed downwards, i.e. in the direction of the motherboard. This is undesirable for proper cooling of the components. Cooling is already problematic as it is, because the riser card arranged centrally of the motherboard highly impedes the air flow along the expansion cards.

It is noted that WO-A-93/20517 discloses a riser card on which in a line next to each other an ISA connector and a PCI connector are provided. However, the card involved here is a special type of riser card, which comprises supplementary logic circuits which are intended to convert the specific logic of the expansion card, such as ISA, PCI, Local Bus, RISA, MCA, etc., into logic which is suitable for a "processor-direct bus" on the motherboard.

It is noted that U.S. Pat. No. 5,121,295 discloses a computer with a motherboard comprising on the side thereof a connector for a riser card. However, this concerns a notebook computer and not a desktop computer as with the present invention, and the riser card only comprises a single connector for an expansion card.

SUMMARY OF THE INVENTION

The object of the present invention is to provide a solution to the problems outlined above, by which in a simple and effective manner all of these problems are eliminated and moreover additional advantages are obtained.

To that end, the invention provides a motherboard of the above-mentioned type, characterized in that the connector for the riser card is arranged adjacent a side edge of the motherboard and substantially parallel thereto, the plug-in openings of the connectors for the expansion cards being directed towards the middle portion of the motherboard; the riser card has one position where either an expansion card of the ISA type or an expansion card of the PCI type can be arranged in that, at that position, a connector of the ISA type and a connector of the PCI type are arranged above each other and parallel to each other; and the riser card comprises above that one position at least one position for an expansion card of the ISA type, at which position a connector of the ISA type is arranged, and/or under that one position at least one position for an expansion card of the PCI type, at which position a connector of the PCI type is arranged.

By the single measure according to the invention, all at once a large number of problems are solved and unexpected advantages are obtained. The connectors for the PCI expansion cards can now be arranged in the lower part of the riser card, so that the linking tracks to these cards can be short, which is particularly advantageous for the 33 MHz signals which are processed by the PCI expansion cards. Further, the components of the PCI expansion cards now come to lie with their top side up, so that the cooling of the components is considerably better, which is important in particular for PCI expansion cards. The cooling of both PCI expansion cards and ISA expansion cards is already considerably improved as it is, because as a result of the movement of the riser card to the side of the motherboard, the air stream of the fan, which is mostly arranged in the power supply unit of the personal computer, can flow freely over the entire motherboard without being blocked for a large part by a riser card arranged centrally on the motherboard. Fitting the expansion cards in the connectors remains as simple as in the case of a riser card arranged centrally on the motherboard, but a great advantage is that the housing of the computer, the case, need not, as in the existing personal computers of the LPX type, have a virtually level bottom plate and a hood-shaped cover, which is necessary in the existing personal computers to be able to place the expansion cards from the side into the connectors on the riser card, but may consist of an easy-to-form box, U-shaped in front and side elevation, on which a flat cover can be placed. From the point of view of production technique, this is much more attractive and, in particular, cheaper, while moreover with such cases the shielding from electromagnetic fields is better. A further advantage is that there are no longer any problems caused by the many terminals of the connector for the riser card on the motherboard. Especially in the case of riser cards with both PCI connectors and ISA connectors, the number of terminals of the connector for the riser card is particularly large and it is hardly possible, if at all, to traverse the area of these terminals to provide linking tracks which connect components on the motherboard on one side of the connector for the riser card to components on the motherboard on the other side thereof. Finally, it is an advantage that now room is left on the motherboard next to the expansion cards, where larger components, such a memory modules, upgrade processors and coprocessors can be arranged, which area is moreover properly cooled.

The invention further relates to a computer of the AT type provided with a motherboard with a connector for a riser card to be arranged vertically on the plane of the motherboard and with a riser card arranged in that connector, said riser card having a predetermined number of positions for expansion cards and comprising a number of connectors, substantially arranged in a row parallel to each other, for expansion cards, while the plane of an expansion card, when it is arranged in a connector of the riser card, extends substantially parallel to the plane of the motherboard, characterized in that the connector for the riser card is arranged adjacent a side edge of the motherboard and substantially parallel thereto, the plug-in openings of the connectors for the expansion cards being directed to the middle part of the motherboard; the riser card has one position where either an expansion card of the ISA type or an expansion card of the PCI type can be arranged in that, at that position, a connector of the ISA type and a connector of the PCI type are arranged above each other and parallel to each other; and the riser card comprises above that one position at least one position for an expansion card of the ISA type, at which position a connector of the ISA type is arranged, and/or under that one position at least one position for an expansion card of the PCI type, at which position a connector of the PCI type is arranged.

BRIEF DESCRIPTION OF THE DRAWINGS

The invention will be explained hereinafter on the basis of an exemplary embodiment, with reference to the drawing. In the drawing.

DETAILED DESCRIPTION

Figure 1:
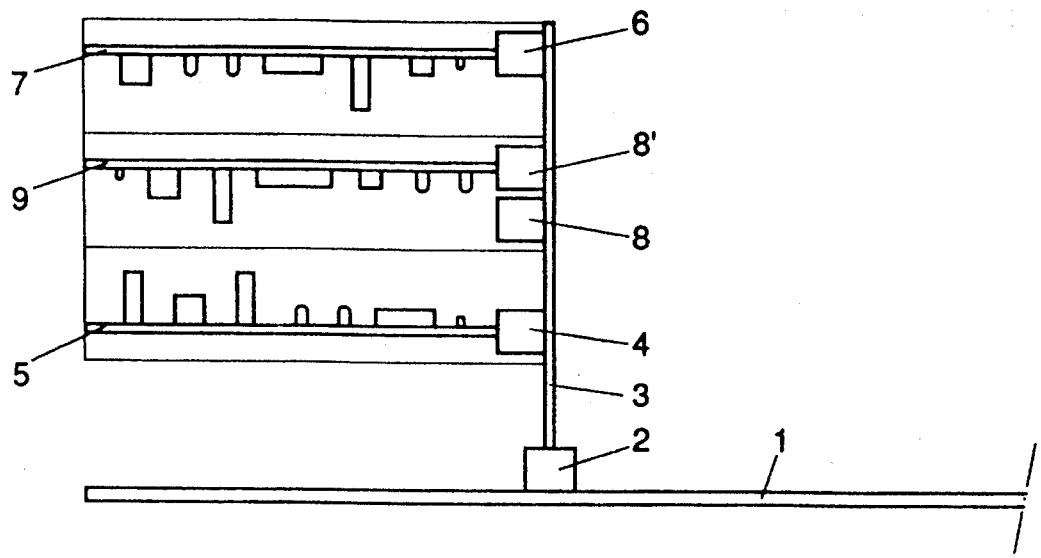
FIG. 1 shows the arrangement of ISA and PCI expansion cards in a riser card in a conventional LPX form factor motherboard.

FIG. 1 diagrammatically shows a front view of a motherboard 1 for a personal computer of the AT type on which a connector 2 is arranged for a riser card 3. According to the exemplary embodiment, the riser card 3 comprises three positions for expansion cards and to that effect comprises a connector 4 for an expansion card 5 of the ISA type, a connector 6 for an expansion card 7 of the PCI type, and a combi-connector 8, 8', which is so arranged that at one position, as desired, either a PCI expansion card or an ISA expansion card can be arranged. As an example, a PCI expansion card 9 is arranged in the combined connector. Due to the specific form of the PCI expansion cards, whereby the components, with respect to an ISA expansion card, are in fact arranged on the underside of the card, which has been done to make it possible at all to use combi connectors for PCI and ISA expansion cards, the only possibility, while maintaining a minimum height of the riser card 3 at a given number of positions for expansion cards, is to fit the PCI expansion cards in the upper part of the riser card 3 and the ISA expansion cards in the lower part, with the combined connector arranged therebetween. This has the above-described disadvantages as regards the cooling of the components on the PCI expansion card and the longer linking tracks over the riser card for the high-frequency signals for the PCI expansion card. In addition, it can be clearly seen how the riser card blocks the free circulation of the air over the motherboard, and any skilled person can also readily imagine that the connector 2 in the middle of the motherboard renders more difficult the routing for linking tracks of components on the motherboard on one side of the connector to components on the other side of the connector.

Figure 2:
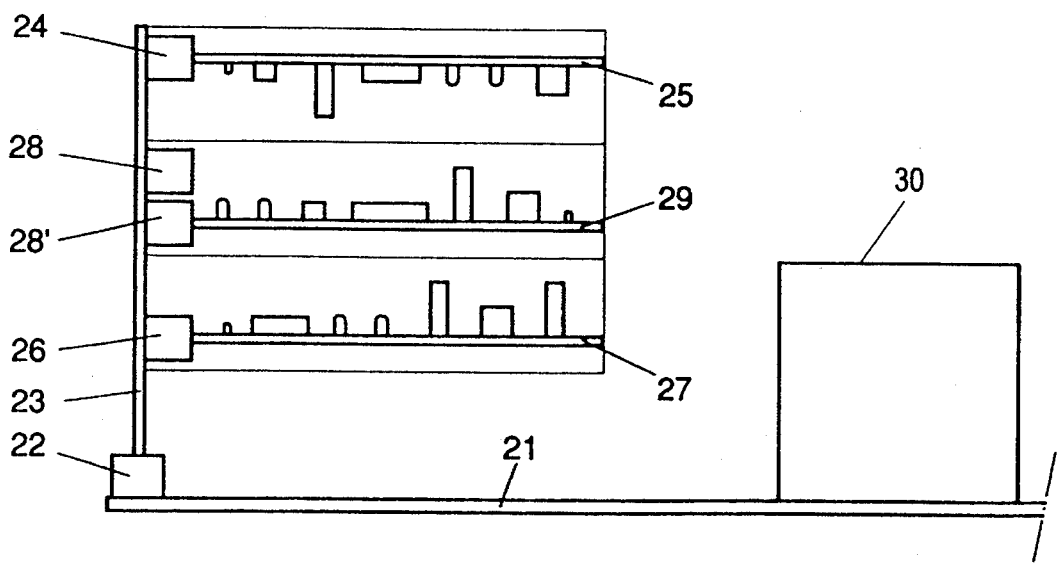
FIG. 2 shows the arrangement of ISA and PCI expansion cards in a riser card arranged on the motherboard in the manner of the invention.

In FIG. 2 corresponding parts are designated by the same reference numerals as in FIG. 1, but preceded by the number 2.

FIG. 2 shows how, in accordance with the invention, by moving the connector 22 for a riser card 23 to the side of the motherboard 21, the above-outlined problems are obviated and additional advantages are obtained. On the riser card 23, the connector 26 for the PCI expansion card 27 is now arranged closest to the motherboard 21. The combi-connector 28, 28' is located in the middle again and the connector 24 for the expansion card 25 of the ISA type now lies entirely at the top of the riser card. As a result, now the components on the ISA expansion card 25 are directed downwards, but this is considerably less objectionable than the components on the PCI expansion card being directed downwards. The PCI expansion cards 27 and 29 can now be arranged with their components directed upwards, while the connections to these expansion cards can be considerably shorter than in the situation shown in FIG. 1. The cooling of all expansion cards is optimal because the air flow from the diagrammatically depicted power supply unit 30, in which a fan is arranged, can flow freely over the motherboard and between the expansion cards 25, 27 and 29. In the space between the power supply unit 30 and the expansion cards, there is now room on the motherboard for relatively high components, such as the CPU, SIMMS, upgrade processors with base, co-processors with base, etc., which components are optimally cooled and to which components the linking tracks can be laid in simple manner because the motherboard is not interrupted by the many terminals of the connector 22.

Although the motherboard according to the invention is applicable in various type of housings for personal computers of the AT type, in which there is a need for a riser card with at least two but preferably more positions for expansion cards, the motherboard has the most advantages when used in a computer of the desktop type, because in that case the advantages described have the most effect.

Figure 3:
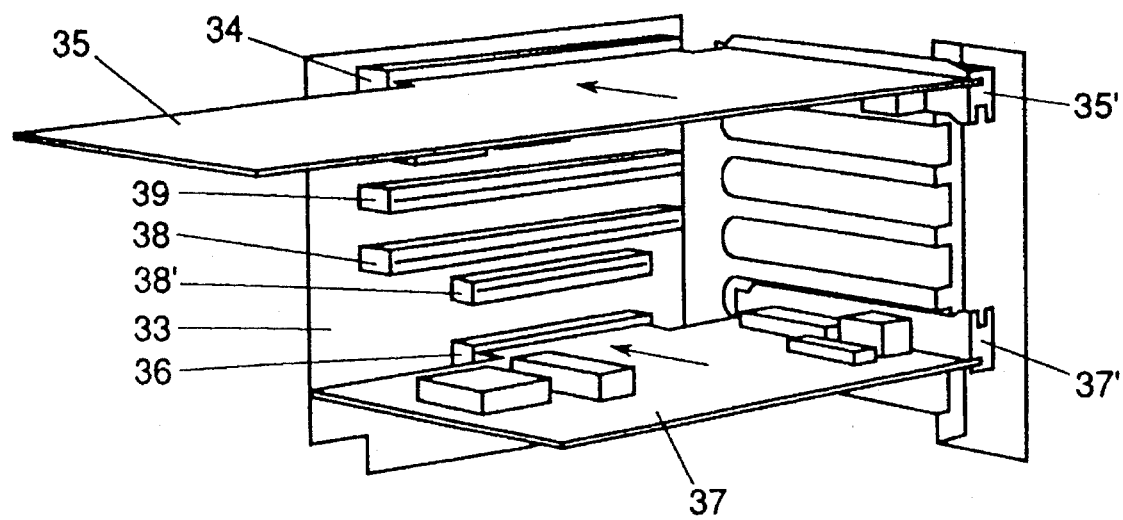
FIG. 3 shows a perspective view of a riser card on which connectors and expansion cards are arranged in the manner of the invention.

FIG. 3, for further clarification, shows a perspective view which shows in what way an ISA expansion card 35 and a PCI expansion card 37 can be placed in their respective connectors 34 and 36, which connectors are now arranged on a riser card 33 comprising two ISA connectors 34 and 39, a combi-connector 38, 38', and a PCI connector 36. The mounting plates 35' and 37', by means of which the expansion cards can be secured to the computer case, are also well visible in FIG. 3.

Figure 4:
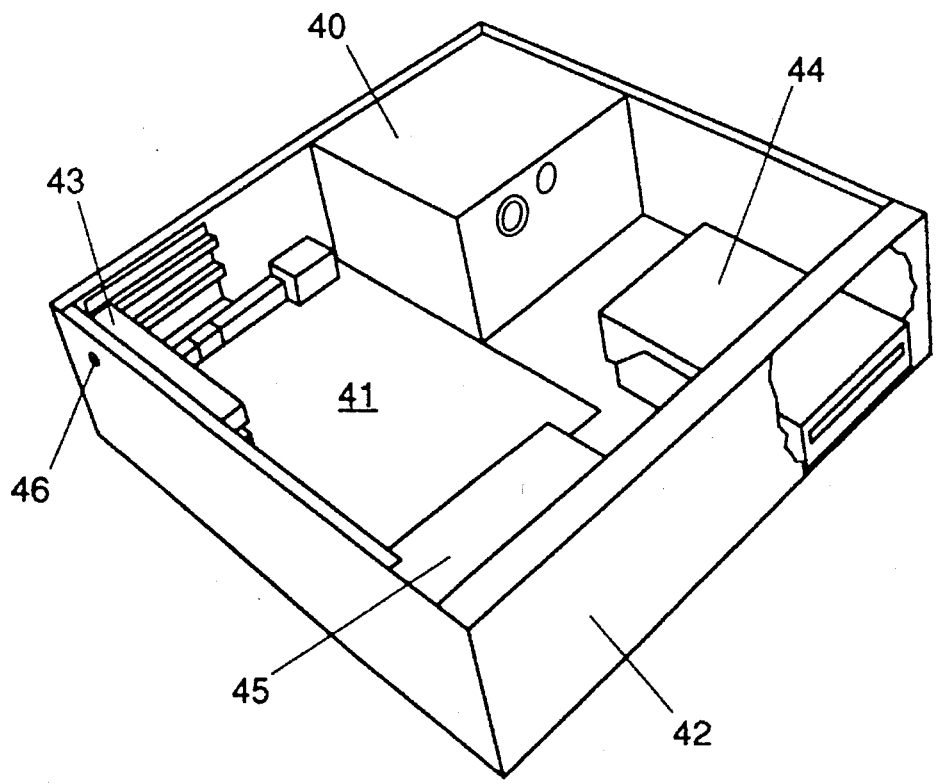
FIG. 4 shows a perspective view of a case for a personal desktop computer of the AT type with a motherboard according to the invention.

FIG. 4 shows a perspective view from which it appears that the motherboard 41 can be placed in a simple, box-shaped case 42 for a desktop computer, which can be closed with a simple plate-shaped cover, not shown. Such a case construction is considerably cheaper than the known case construction for personal desktop computers of the AT type with a U-shaped cover and provides better shielding from electromagnetic fields. In addition, the top of the riser card 43 can be fixed to the side of the case in a simple manner, for instance by means of a bolt 46, which is of importance because when arranging and removing expansion cards, a relatively large force must be exerted. Further arranged in the case are the power supply unit 40, a floppy disk drive 44 and a hard disk drive 45.

I claim:

1. An assembly for use in a personal computer, said assembly comprising:

a motherboard;

a mating connector for a riser card, said mating connector situated on the motherboard and adjacent and parallel to a peripheral side edge thereof, said mating connector having an opening adapted to receive a riser card, said mating connector being oriented on the motherboard such that the opening extends in a direction perpendicularly upward from a horizontal surface of the motherboard; and the riser card having a predetermined number of expansion positions thereon, each of said positions having at least one expansion connector associated therewith so as to form a plurality of expansion connectors located on the riser card such that a plurality of expansion boards can be simultaneously mated through said expansion connectors to said riser card, said one expansion connector being either an ISA (industry standard architecture) or a PCI (peripheral connect interface) type connector so as to respectively accommodate an ISA or PCI type expansion board, all of the expansion connectors being horizontally oriented and successively arranged in a parallel fashion one above another, and said riser card being oriented with respect to the motherboard such that each one of the plurality of expansion boards inserted into a corresponding one of said expansion connectors is oriented in a direction substantially parallel to a horizontal plane of the motherboard and extends inward from a vicinity of the side edge towards a central portion of the motherboard;

wherein a predefined one of the positions on the riser card has both ISA type and PCI type expansion connectors associated therewith and situated one above another so as to accommodate either an ISA type or a PCI type expansion board in said predefined one position, wherein said predefined one position is located on the riser card below at least one of the positions having the ISA type expansion connector and above at least one of the positions having the PCI type expansion connector.

2. A personal computer having:

a motherboard;

a mating connector for a riser card, said mating connector situated on the motherboard and adjacent and parallel to a peripheral side edge thereof, said mating connector having an opening adapted to receive a riser card, said mating connector being oriented on the motherboard such that the opening extends in a direction perpendicularly upward from a horizontal surface of the motherboard; and the riser card having a predetermined number of expansion positions thereon, each of said positions having at least one expansion connector associated therewith so as to form a plurality of expansion connectors located on the riser card such that a plurality of expansion boards can be simultaneously mated through said expansion connectors to said riser card, said one expansion connector being either an ISA (industry standard architecture) or a PCI (peripheral connect interface) type connector so as to respectively accommodate an ISA or PCI type expansion board, all of the expansion connectors being horizontally oriented and successively arranged in a parallel fashion one above another, and said riser card being oriented with respect to the motherboard such that each one of the plurality of expansion boards inserted into a corresponding one of said expansion connectors is oriented in a direction substantially parallel to a horizontal plane of the motherboard and extends inward from a vicinity of the side edge towards a central portion of the motherboard;

wherein a predefined one of the positions on the riser card has both ISA type and PCI type expansion connectors associated therewith and situated one above another so as to accommodate either an ISA type or a PCI type expansion board in said predefined one position, wherein said predefined one position is located on the riser card below at least one of the positions having the ISA type expansion connector and above at least one of the positions having the PCI type expansion connector.

3. The personal computer of claim 2 wherein the computer is a desktop type and has a housing, said housing being formed of:

a box with a rectangular bottom plate and four upright walls integral with the bottom plate, wherein the riser card is affixed to one of the walls; and a substantially flat, plate-shaped cover situated above and abutting against all of said walls so as to close the box.

4. A personal computer having:

a motherboard;

a mating connector for a riser card, said mating connector situated on the motherboard and adjacent and parallel to a peripheral side edge thereof, said mating connector having an opening adapted to receive a riser card, said mating connector being oriented on the motherboard such that the opening extends in a direction perpendicularly upward from a horizontal surface of the motherboard; and the riser card having a predetermined number of expansion positions thereon, each of said positions having at least one expansion connector associated therewith so as to form a plurality of expansion connectors located on the riser card such that a plurality of expansion boards can be simultaneously mated through said expansion connectors to said riser card, said one expansion connector being either a first bus type or a second bus type connector so as to respectively accommodate a first bus type or a second bus type expansion board, all of the expansion connectors being horizontally oriented and successively arranged in a parallel fashion one above another, and said riser card being oriented with respect to the motherboard such that each one of the plurality of expansion boards inserted into a corresponding one of said expansion connectors is oriented in a direction substantially parallel to a horizontal plane of the motherboard and extends inward from a vicinity of the side edge towards a central portion of the motherboard;

wherein a predefined one of the positions on the riser card has both said first and second bus type expansion connectors associated therewith and situated one above another so as to accommodate either said first bus type or said second bus type expansion board in said predefined one position, wherein said predefined one position is located on the riser card below at least one of the positions having the first type expansion connector and above at least one of the positions having the second bus type expansion connector.

5. The personal computer of claim 4 wherein the first and second bus type are ISA (industry standard architecture) and PCI (peripheral connect interface) busses, respectively, and said first and second bus type expansion boards are ISA and PCI type expansion boards, respectively.

6. The personal computer of claim 5 wherein the computer is a desktop type and has a housing, said housing being formed of:

a box with a rectangular bottom plate and four upright walls integral with the bottom plate, wherein the riser card is affixed to one of the walls; and a substantially flat, plate-shaped cover situated above and abutting against all of said walls so as to close the box.

* * * * *

UNITED STATES PATENT AND TRADEMARK OFFICE
Certificate

Patent No. 5,594,621                                                                     Patented: January 14, 1997

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Herman W. van Rumpt, 's-Hertogenbosch, Netherlands, and Joseph J.P.M. Muller, 's-Hertogenbosch, Netherlands.

Signed and Sealed this Thirteenth Day of August 2002.

DARREN SCHUBERG
*Supervisory Patent Examiner*
Art Unit 2835